United States Patent [19]

Combs

[11] Patent Number: 5,596,231
[45] Date of Patent: Jan. 21, 1997

[54] HIGH POWER DISSIPATION PLASTIC ENCAPSULATED PACKAGE FOR INTEGRATED CIRCUIT DIE

[75] Inventor: Edward G. Combs, Foster City, Calif.

[73] Assignee: Asat, Limited, Hong Kong, Hong Kong

[21] Appl. No.: 348,288

[22] Filed: Nov. 30, 1994

Related U.S. Application Data

[63] Continuation of Ser. No. 981,927, Nov. 24, 1994, abandoned, which is a continuation of Ser. No. 740,555, Aug. 5, 1991, abandoned.

[51] Int. Cl.$^6$ .............................. H01L 23/34; H05K 7/20
[52] U.S. Cl. .................... 257/776; 257/712; 257/719; 361/688; 361/704; 361/707; 361/709; 361/713
[58] Field of Search .................... 357/67, 80, 81, 357/71, 74, 72; 257/712, 713, 714, 717, 718, 719, 720, 787, 796; 361/676, 688, 697, 702, 704, 705, 707, 708, 709, 711, 713

[56] References Cited

U.S. PATENT DOCUMENTS

| | | | |
|---|---|---|---|
| 3,469,017 | 9/1969 | Starger | 357/72 |
| 3,611,065 | 10/1971 | Zochauer et al. | 357/81 |
| 3,646,409 | 2/1972 | van de Water et al. | 317/234 R |
| 4,518,983 | 5/1985 | Longenecker et al. | 357/81 |
| 4,796,083 | 1/1989 | Cherukun et al. | 357/67 |
| 4,811,166 | 3/1989 | Alvarez et al. | 357/81 |
| 4,916,518 | 4/1990 | Yoshimura | 357/70 |
| 4,961,106 | 10/1990 | Butt et al. | 357/74 |
| 4,971,633 | 11/1990 | Beavis et al. | 357/81 |
| 4,975,761 | 12/1990 | Chu | 357/72 |

FOREIGN PATENT DOCUMENTS

| | | | |
|---|---|---|---|
| 0002281 | 1/1977 | Japan | 357/81 |
| 61-16605 | 7/1986 | Japan | 257/796 |

OTHER PUBLICATIONS

IBM Technical Disclosure Bulletin vol. 33, No. 3A Aug. 1990.

Electrical isolation of copper thermal cooling device by anodizing aluminum layer on cavity walls.

*Primary Examiner*—Carl Whitehead, Jr.
*Attorney, Agent, or Firm*—Skjerven, Morrill, Franklin & Friel; Edward C. Kwok

[57] ABSTRACT

A structure and a method provide an assembly for receiving an integrated circuit die. The assembly comprises a heat sink selectively coated with electrically insulative material. The heat sink is attached by one of various methods directly on to the integrated circuit die and a lead frame for external electrical connections. The heat sink is formed as a stepped structure to increase the path of moisture penetration so as to improve moisture resistance and reliability. In one embodiment of the present invention, the electrically insulative material comprises anodized aluminum, which is formed on the heat sink by a vapor deposition step, followed by a hard anodization step. Other electrical insulative material which can be thinly applied on the surface of the heat sink are non-conductive resins and polymers. The heat sink is formed out of copper or a copper alloy, selected for strength and electrical and thermal conductivities. The heat sink can be connected to a power or a ground terminal of the integrated circuit, which is bonded on the heat sink on an exposed (i.e. unaluminized) exposed area of the heat sink. The exposed area of the heat sink is formed either by a step which masked off the exposed area from the aluminum deposition step, or by a subtractive process, such as sandblasting, to selectively removing the anodized aluminum. In one embodiment, the assembly is encapsulated in plastic with one side of the heat sink flush with one outer surface of the plastic encapsulation.

18 Claims, 10 Drawing Sheets

HIGH POWER DISSIPATION PLASTIC ENCAPSULATED PACKAGE FOR INTEGRATED CIRCUIT DIE

This application is a continuation of application Ser. No. 07/981,927, filed Nov. 24, 1994 now abandoned, which is a continuation of application Ser. No. 07/740,555 filed Aug. 5, 1991, now abandoned.

FIELD OF THE INVENTION

This invention relates to integrated circuit packages and package assembly, and in particular, relates to plastic integrated circuit packages and package assembly for high power dissipation.

BACKGROUND OF THE INVENTION

Metal heat sinks or cooling blocks have been used extensively to improve heat dissipation from integrated circuit packages. For example, U.S. Pat. No. 3,646,409, entitled "Heat-sinking Package for Semiconductor Integrated Circuit," by van der Water et al, filed Jul. 29, 1969, issued Feb. 29, 1972, discloses a double-molded package in which a copper cooling block and, optionally, a cooling plate are provided for heat dissipation away from the lead conductors.

In providing a metal heat sink in a package, care must be taken to avoid unintended electrical short circuit forming between the heat sink and the lead frame or other electrical conductors in the package. Such short circuits are avoided by providing insulating layers, such as printed circuit board material, non-conducting resins and other insulating material. However, because an electrically insulative material is often also thermally insulative, such material preferably is provided with minimum thickness to avoid excessive loss of the ability to dissipate heat in the resulting package. For example, U.S. Pat. No. 4,916,518, entitled "Plastic Encapsulated Semiconductor Device and Method for Manufacturing the Same", Y. Yoshimura, filed Jan. 24, 1984, issued Apr. 10, 1990, discloses a heat sink formed from a mount structure of a lead frame. The mount structure is a part of the lead frame adapted for attaching an integrated circuit die. Except for one surface of the mount structure and the externals leads of the lead frames, the lead frame is encapsulated by a layer of electrically insulative resin of uniform thickness. The resin disclosed in the Yoshimura '518 patent is formed by a method which is said to provide a resin thickness (0.1–0.4 mm) thinner than Yoshimura's prior art, while minimizing pin-holes, bubbles or similar defects.

U.S. Pat. No. 4,961,106, entitled "Metal Packages having Improved Thermal Dissipation," by Butt et al., filed Aug. 31, 1987, issued Oct. 2, 1990 discloses a metallic package in which a lead frame is glass-sealed between lid and base portions, and in which the base portion comprises two parts forming a cavity therebetween filled with powder or fluid to facilitate heat dissipation.

The heat sink may also be used as a power or ground plane. For example, U.S. Pat. No. 4,975,761, entitled "High Performance Plastic Encapsulated Package for Integrated Circuit Die," by Chu filed Sep. 5, 1989, issued Dec. 4, 1990, discloses an assembly including an insulating printed circuit board mounted on and electrically insulated from a heat sink, which may serve as a power or ground plane.

However, in the prior art, such as the structures disclosed above, numerous steps are required for assembling materials of various physical characteristics (e.g. epoxy resin, printed circuit board, powder etc.). As a result, the resulting package is expensive to manufacture, thereby increasing the cost of the integrated circuit device.

SUMMARY OF THE INVENTION

In accordance with the present invention, a structure and a method provide an assembly for receiving an integrated circuit die. The assembly comprises a heat sink selectively provided with a layer of electrically insulative material. The heat sink is attached by one of various methods directly on to the integrated circuit die and a lead frame for providing external electrical connections. The heat sink is formed as a stepped structure to increase moisture resistance and reliability by increasing the path of moisture penetration. Such stepped structure also contributes to durability of the resulting package.

In one embodiment of the present invention, the electrically insulative material comprises hard-anodized aluminum, which is first formed on the heat sink by a vapor deposition step, and then followed by a hard anodization step. The heat sink in accordance with the present invention can be formed out of copper or a copper alloy, selected for strength and electrical and thermal conductivities. The heat sink can be connected to a power or ground terminal of the integrated circuit, which is bonded on the heat sink at an exposed (i.e. unaluminized) area of the heat sink. The exposed area of the heat sink is formed either by a step which masked off the exposed area from the aluminum deposition, or by subtractive forces, such as a sand-blasting step, selectively removing the deposited aluminum before anodization. In this embodiment, the assembly is encapsulated in plastic with one side of the heat sink flush with one outer surface of the plastic encapsulation.

In addition to providing a moisture resistance package, the heat sink in accordance with the present invention provides heat dissipation efficiency because of the layer of thermally conductive and electrically insulating material selectively provided on the heat sink. The thermal conductivity of this layer facilitates in maintaining a desirable wire bonding temperature when a thermosonic wire bonding technique is used. Further, because the electrically insulative material is integrally formed on the surface of the heat sink, the number of assembly steps necessary to provide the integrated circuit device in a plastic package is minimized. As a result, the assembly yield of such a package is high, thereby substantially reducing the cost of providing the integrated circuit device.

The present invention is better understood upon consideration of the following detailed description and the accompanying drawings.

DETAILED DESCRIPTION OF THE PREFERRED EMBODIMENTS

The present invention provides a high performance high power dissipation plastic encapsulated package for an integrated circuit device. The plastic encapsulated package comprises, among other elements, a heat sink on which a lead frame and an integrated circuit die are attached.

Figure 1:
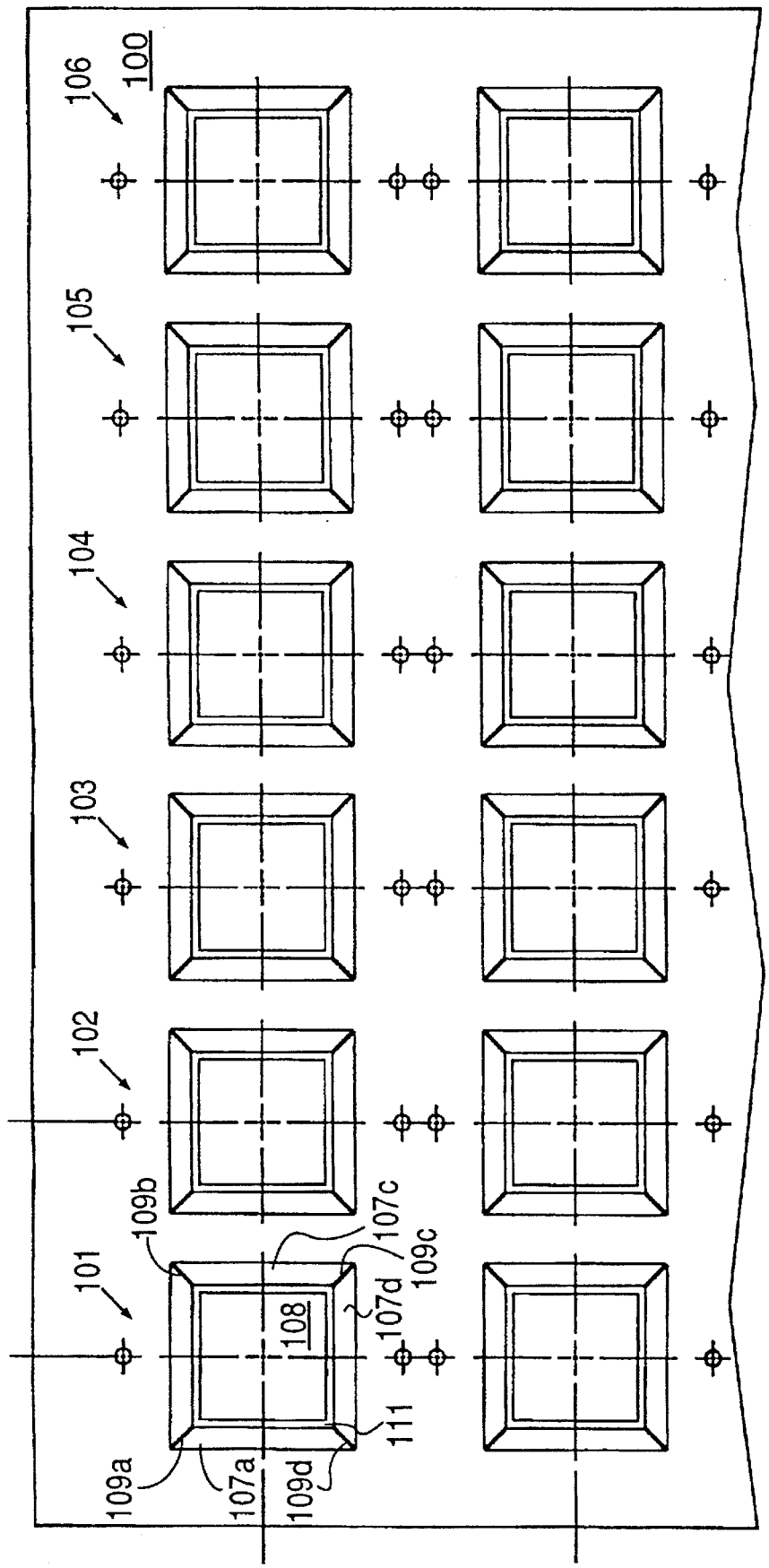
FIG. 1 shows a metal panel 100 patterned for providing six heat sink structures 101–106 of the present invention.

One embodiment of the heat sink in accordance with the present invention is formed from a metal panel, such as metal panel 100 of FIG. 1. As shown in FIG. 1, an array of structures, such as structures 101–106, each patterned to form a heat sink are provided on metal panel 100. Metal panel 100 is 0.07" thick, although any suitable thickness can also be used. Although shown in FIG. 1 as being large enough to provide six heat sinks per row, metal panel 100 can be of any suitable vertical and horizontal dimensions. Suitable materials for providing metal panel 100 include copper and copper alloys. Such alloys include but are not limited to copper, copper and zinc, or copper and iron. If the aluminizing process described below is to be used, such copper alloys, however, should not contain sulphur, chlorine or phosphorus. These materials are chosen for mechanical strength, availability, and both thermal and electrical conductivities. For best thermal conductivity, oxygen-free high conductivity copper (OFHC) is the preferred material. Because the heat sink of the present invention is formed by an electrically conductive material this heat sink can be connected to the power or ground terminals of the integrated circuit die. Thermally conductive material, such as beryllium and certain ceramics, can also be used as heat sink. Such material typically have a lower thermal conductivity than copper, and therefore are less efficient heat dissipators.

Structures 101–106 are provided on the metal panel 100 by a photolithographical step on the surface of the metal panel 100 using a photoresist, such as du Pont's dry photo resist film applied on by lamination. The metal panel is then subject to a chemical etch process. Two examples of suitable etchants for this chemical etch process are ferrous chloride and cupric chloride. The etch process leaves area 108 of structure 101 intact, "half-etches" area 111 of structure 101, and completely etches areas 107a, 107b, 107c and 107d of the structure 101. In this etch process, while an area to be completely etched is etched from both top and bottom surfaces of the metal panel, a "half-etch" area is etched only from one side of the metal panel. The half-etched area 111 of structure 101 has a thickness less than the 0.07" at the intact area 108, forming a stepped structure (see FIG. 3, described below). In this embodiment, the thickness at area 108 is selected to be substantially one half the height of the plastic mold used at a later step to encapsulate the heat sink, the integrated circuit die and the lead frame. By choosing such thickness, a package can be made (to be described below in conjunction with FIG. 12) such that one surface of the heat sink is flush with one outer surface of the plastic encapsulation so as to facilitate heat dissipation to the external environment. Alternatively, a thinner heat sink can be totally encapsulated by the plastic package material. In such a totally encapsulated heat sink, heat is dissipated to the environment from the surface of the heat sink through the layer of the package material. Therefore, such thinner heat sink is not as effective as when the heat sink is designed to flush with one surface of the plastic encapsulation. However, a totally encapsulated heat sink does not provide a potential path for moisture at the interface between the plastic material and the heat sink, thereby resulting in better moisture resistance. Further, the cost of providing a package using a totally encapsulated heat sink is less than the cost of having one side of the heat sink flush with the package. In some applications, e.g. where an integrated circuit consumes low average power but has a high instantaneous power requirement, such lower cost package may be suitable.

The structure 101 can be severed from the metal panel 100 at the connecting strips 109a, 109b, 109c and 109d. One such severed structure is shown as the heat sink 200 or 250 in FIGS. 2–5. For ease of handling, in the remaining of the manufacturing process, the structures need not be severed into individual heat sinks after the chemical etch process. The panel may, however, be cut into strips each containing one row of etched heat sink structures.

Figure 2:
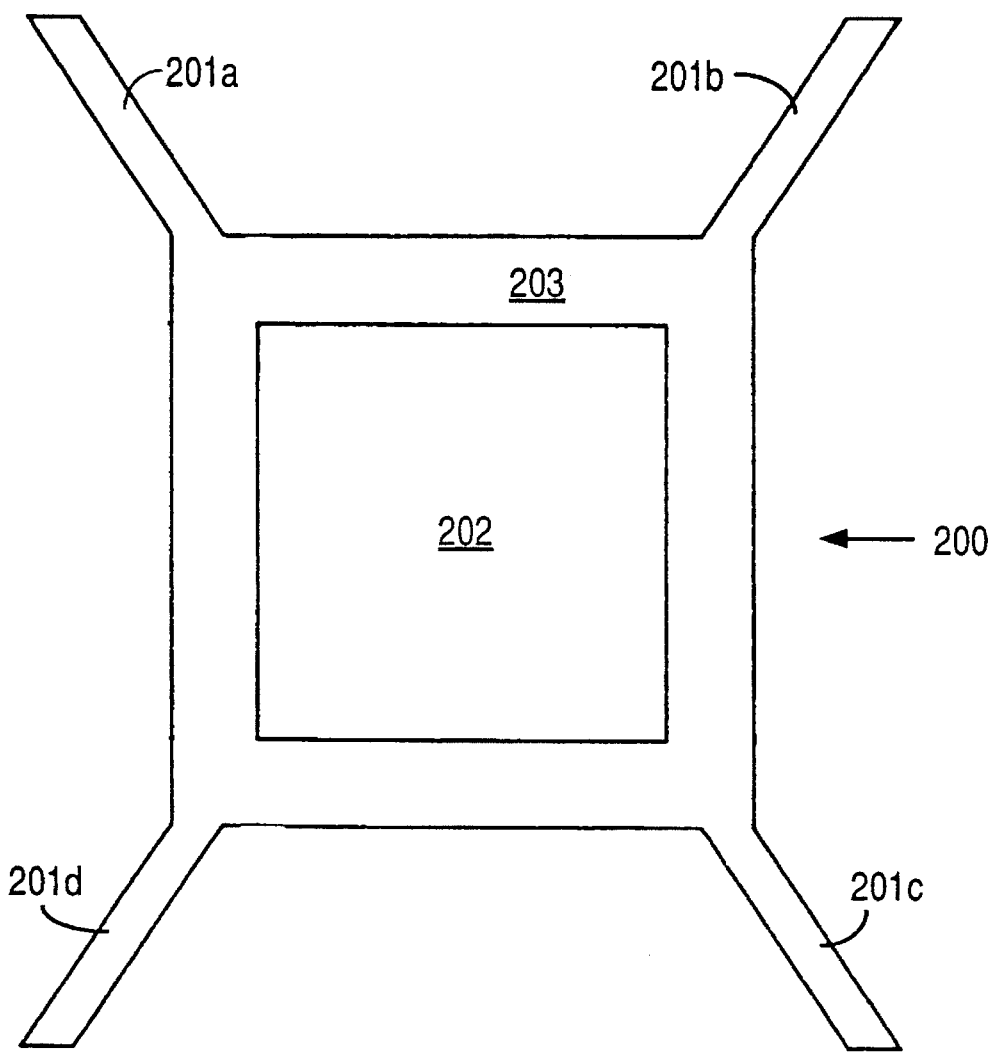
FIG. 2 is a top view of a heat sink 200 in accordance with the present invention.
Figure 3:
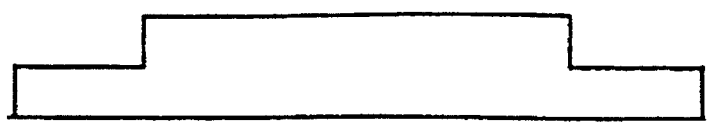
FIG. 3 is a side view of the heat sink 200 of FIG. 2.
Figure 5:
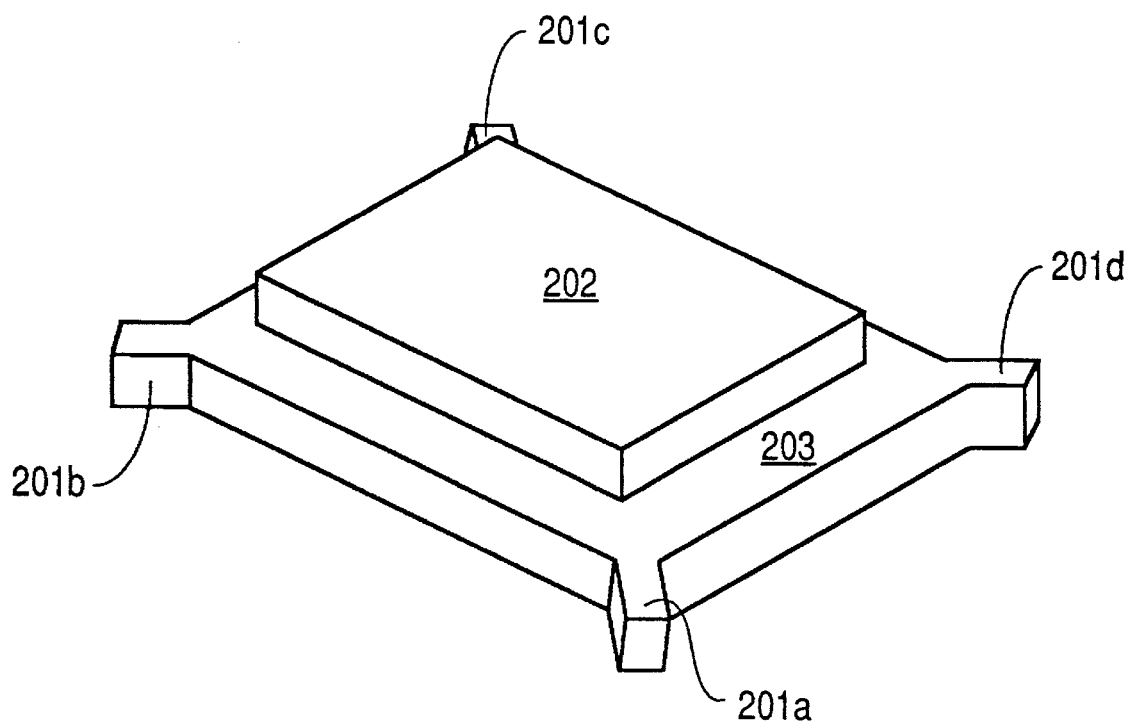
FIG. 5 is an isometric view of the heat sink 200 of FIG. 2.

FIG. 2 is a top view of a heat sink 200 in accordance with the present invention. Although heat sink 200 is formed using a chemical etching step, such heat sink can also be obtained by stamping, milling or any suitable method to provide the shape shown in FIG. 2. In addition, although shown in FIG. 2 with the connecting strips 201a–201d, heat sink 200 can be obtained without the connecting strips 201a–201d. FIGS. 3 and 5 are respectively the side and isometric views of the heat sink 200.

Figure 4:
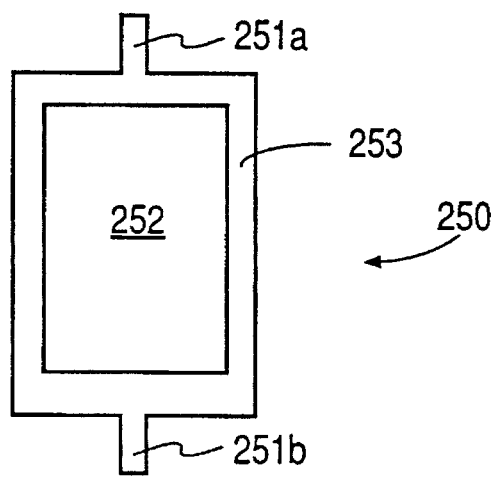
FIG. 4 is a top view of another heat sink 250 in accordance with the present invention.

FIG. 4 is the top view of another heat sink 250, which is an alternative configuration suitable for a plastic dual-in-line package (PDIP) or a smaller outline integrated circuit (SOIC) package. Heat sink 250 has a generally more elongated shape than heat sink 200 of FIG. 2.

After a heat sink, such as heat sink 200 above, is severed from the metal panel, a layer of electrically insulating material is provided on the surface of the heat sink. In this embodiment, to obtain a coating of such material, a thin layer of nickel is plated on the surface of the heat sink, so as to prepare the surface for receiving a 100–500 micro-inch thick layer of aluminum deposited by a vacuum deposition step. Any other suitable thickness of aluminum can also be used. Since the deposited aluminum is used to create at a subsequent step a thin layer of electrical insulator, a thickness above 500 micro-inch is unnecessary. However, to ensure electrical insulation in the final product, the thickness of the deposited aluminum is preferably at least 125 micro-inch. The layer of nickel is provided by an electrochemical plating process known in the art to a thickness sufficient to provide a layer of barrier material, such that the deposited aluminum will not peel or blister from the surface of the heat sink during the subsequent anodization step. Without this barrier material the deposited aluminum may peel away from the copper surface.

A vacuum deposition equipment suitable for providing the vacuum deposition step is disclosed in U.K. Patent Application, No. 8918728.0, entitled "Aluminum vacuum deposition machine for coating parts of lead frames for IC chips," publication no. GB 2234988, published on Feb. 20, 1991, which is hereby incorporated by reference in its entirety. Any other suitable method for providing a thin layer of aluminum can also be used. At this vacuum deposition step, certain areas (e.g., the die attach area and the areas at which the lead frame is expected to attach) on the nickel plated copper core of the heat sink are masked to prevent aluminum deposition. This masking step can be accomplished using a metal mask placed in contact with the heat sink. In one implementation the metal mask is mounted on a severed strip of the metal panel containing a row of heat sink structures, such as structures 101–106. By masking the die attach area, the integrated circuit die can later be attached directly onto the heat sink. Such heat sink can then be connected to a power or a ground terminal of the integrated circuit die.

Figure 6:
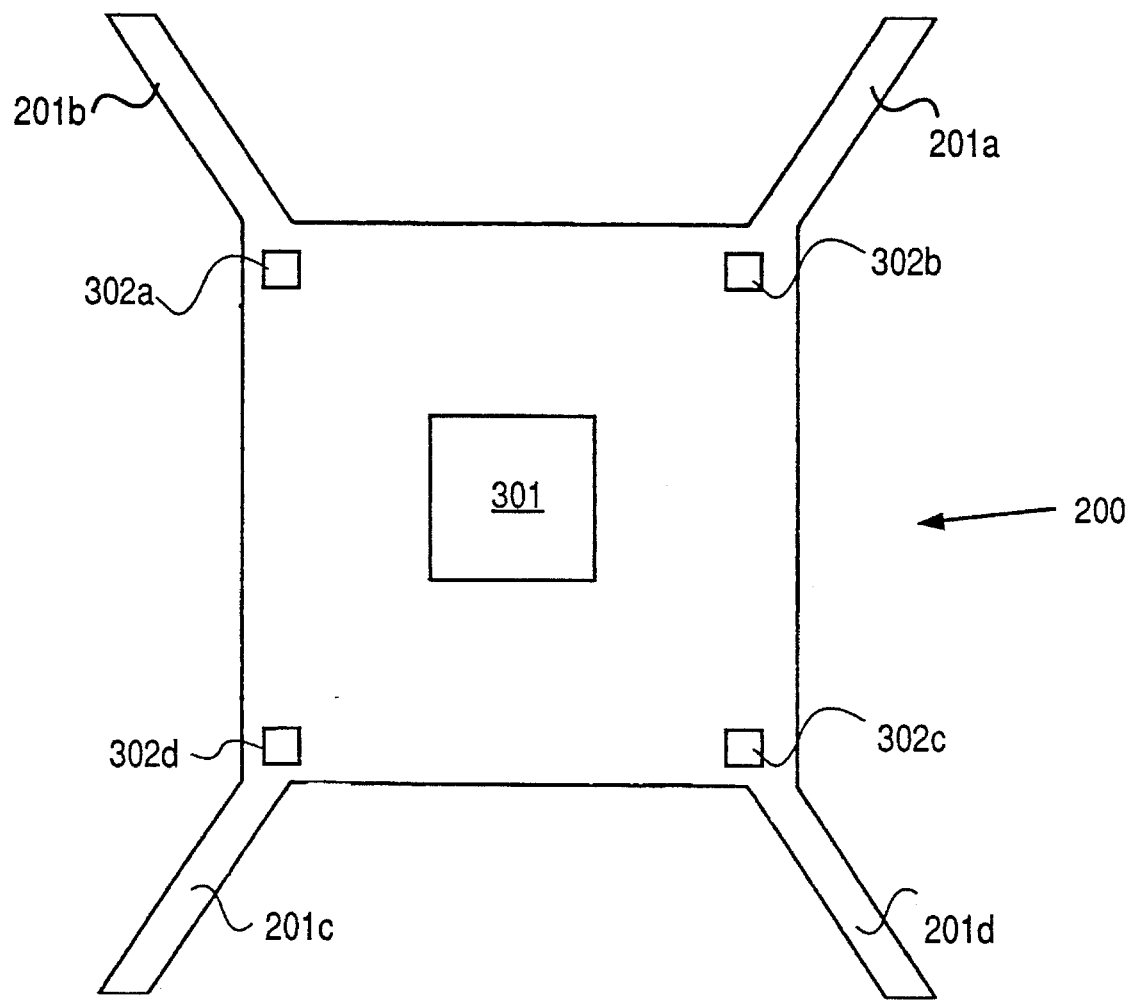
FIG. 6 is a view from the bottom side of the heat sink 200 of FIG. 2, after aluminization, showing areas 301, 302a–d masked in the aluminization process so as to expose the copper block underneath, in accordance with the present invention.
Figure 7:
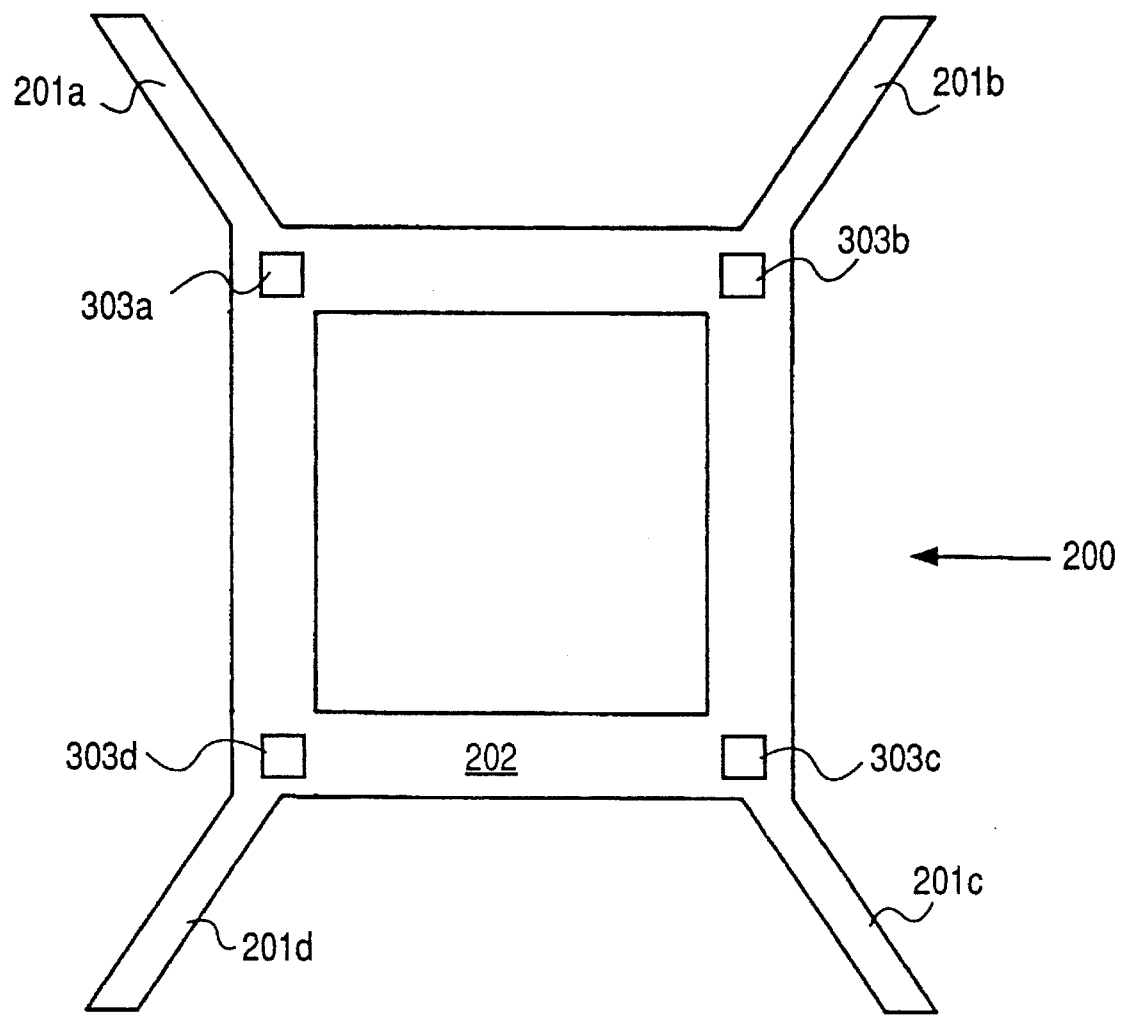
FIG. 7 is a view from the top side of heat sink 200 of FIG. 6.

FIG. 6 shows the bottom view of the heat sink 200 having a centrally located die attach area 301 and lead frame attachment areas 302a, 302b, 302c, and 302d masked. The aluminum deposition process deposits the requisite thickness except at these areas masked. FIG. 7 shows the top view of the heat sink 200. The sides of the heat sink 200 is to be aluminized completely. In FIG. 7, however, areas 303a, 303b, 303c and 303d are also masked off to facilitate resistance welding of the lead frame of the heat sink. However areas 303a, 303b, 303c and 303d need not be masked if another method, other than resistive welding, is used to attach the lead frame to the heat sink.

The aluminized heat sink 200 is then subjected to a "hard anodization" process known in the art, in which the deposited aluminum is oxidized to result in an electrically insulative surface, except at certain areas masked, such as those shown above in conjunction with FIGS. 6–7. As an alternative to using a masking step prior to the aluminization, the person of ordinary skill in the art will appreciate that areas exposing the nickel plated copper core can be obtained by first aluminizing the entire heat sink and then using sandblasting or other appropriate subtractive technique to remove the aluminum from the designated areas before anodizing. The subtractive technique is preferably applied before anodizing, because the anodizing process hardens the deposited aluminum, thereby making it difficult to remove. If desired, gold, silver or other suitable metals can be plated onto the exposed areas, such as areas 301 and 302a–d, to enhance attachments of the integrated circuit die and the lead frame.

In this embodiment, anodized aluminum is chosen as the electrical insulation material because its thermal conductivity is relatively higher than glass, certain non-conductive resins, or other common electrical insulative materials. Also, the aluminum oxide, unlike glass material, are not so brittle as to crack under thermal stress. Other electrical insulative material that can be used include porcelain, which can be provided on a steel heat sink, glass and non-conductive resins or polymers. Non-conductive resins and polymers, preferably those with good thermal conductivity consistent with being electrically non-conductive, can be applied by a silk-screening process to achieve a thin layer (e.g. 1 mil). By contrast, printed circuit boards used for insulating the lead frame from the heat sink in the prior art, which are glass-filled fibre material, are typically greater than 50 mils thick and having thermal conductivity approximate that of glass. Thus, since aluminum oxide is electrically insulative but relatively thermally conductive, the lead frame can be mounted directly onto the heat sink without providing further electrical insulation, and without degrading the heat sink's heat dissipation performance. Attachment of the heat sink 200 to the lead frame 401 is shown in FIG. 8 as a cross section of an assembly 400.

Figure 8:
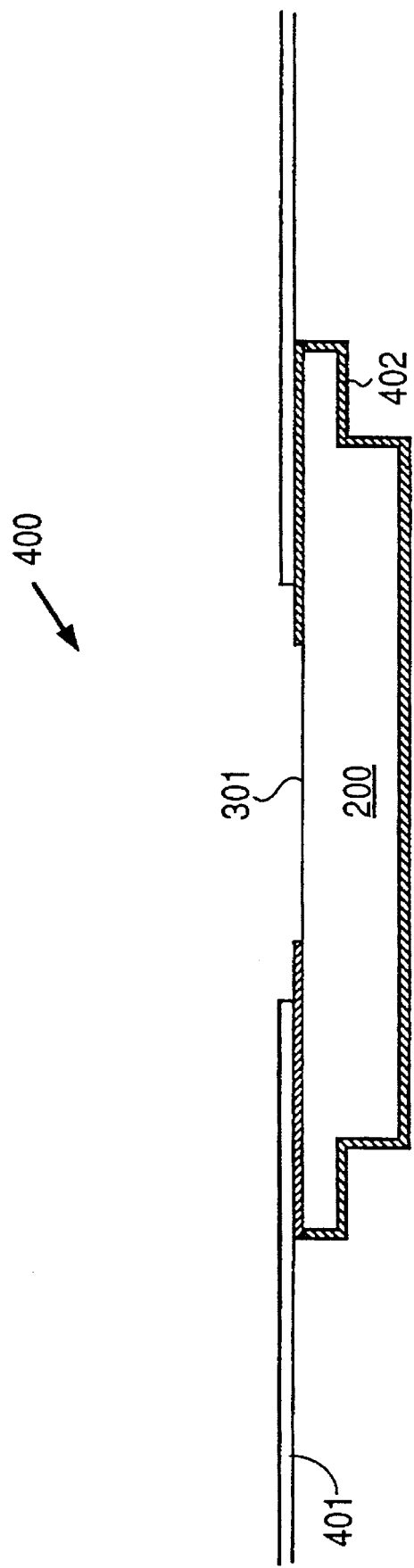
FIG. 8 shows a cross section of an assembly 400, which includes a lead frame 401 and the heat sink 200 of FIG. 6, in accordance with the present invention.

As shown in FIG. 8, a lead frame 401 is attached to heat sink 200 by a resistance welding (also known as "spot-welding") technique known in the art. FIG. 8 shows that the lead frame is insulated from heat sink 200 by a layer 402 of anodized aluminum. FIG. 8 also shows the area 301 for attachment of an integrated circuit die. Area 301 is intentionally left unaluminized in the manner discussed above. Alternatively, attachment of lead frame 401 onto heat sink 200 can be accomplished by other suitable techniques known in the art, such as brazing, attachment by resin, heat soldering or any other appropriate technique for mechanically attaching a heat sink to a lead frame. During the attachment process, the anodized aluminum surface provides the electrical insulation between heat sink 200 and lead frame 401. In addition, adjunct methods can also be used to attach selective leads on the lead frame 401 to heat sink 200 to prevent mechanical movement.

Figure 9:
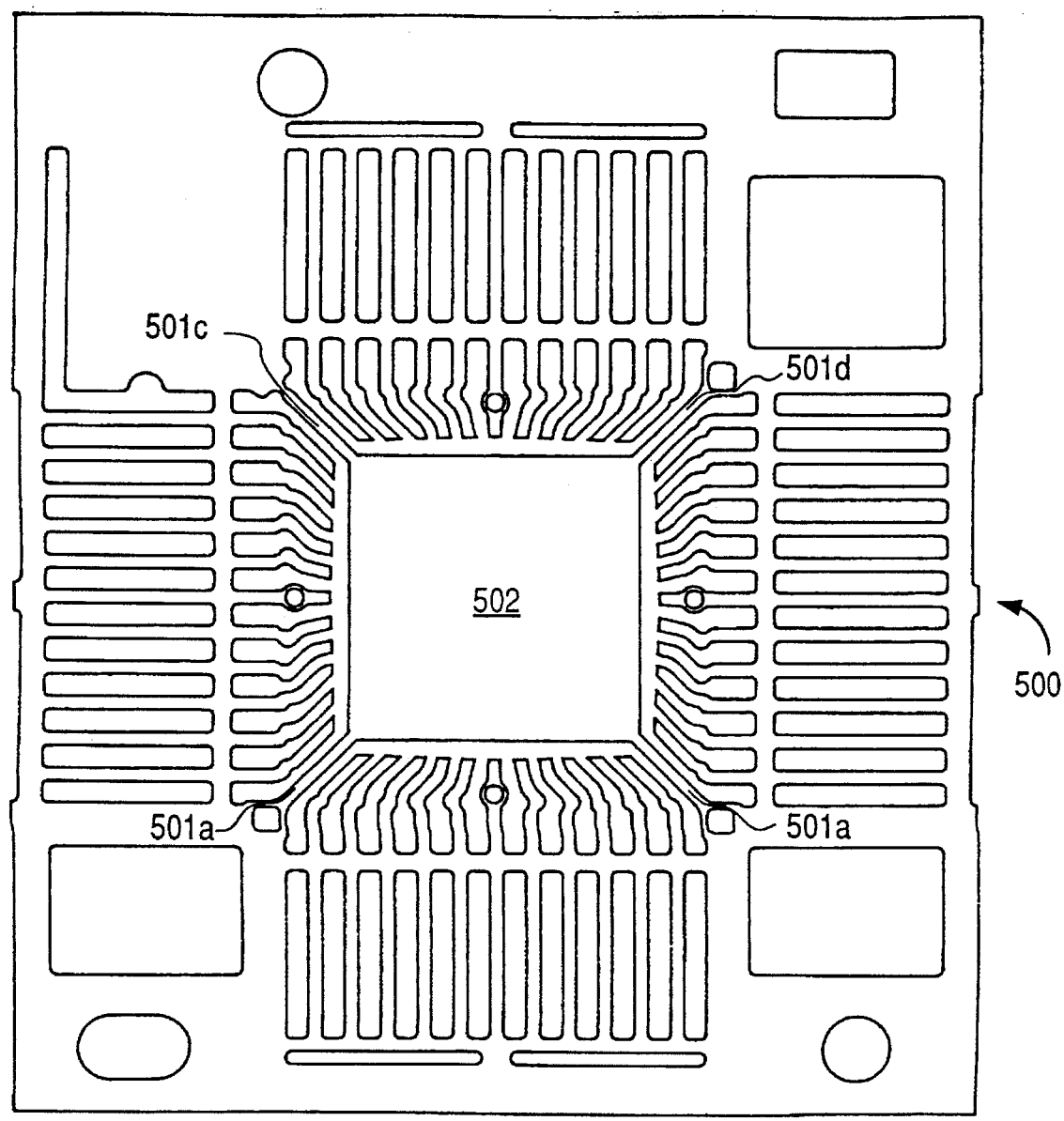
FIG. 9 shows a lead frame 500 having die attach pad 502 and tie bars 501a–s suitable for use as a lead frame 401 in the assembly 400 of FIG. 8.
Figure 10:
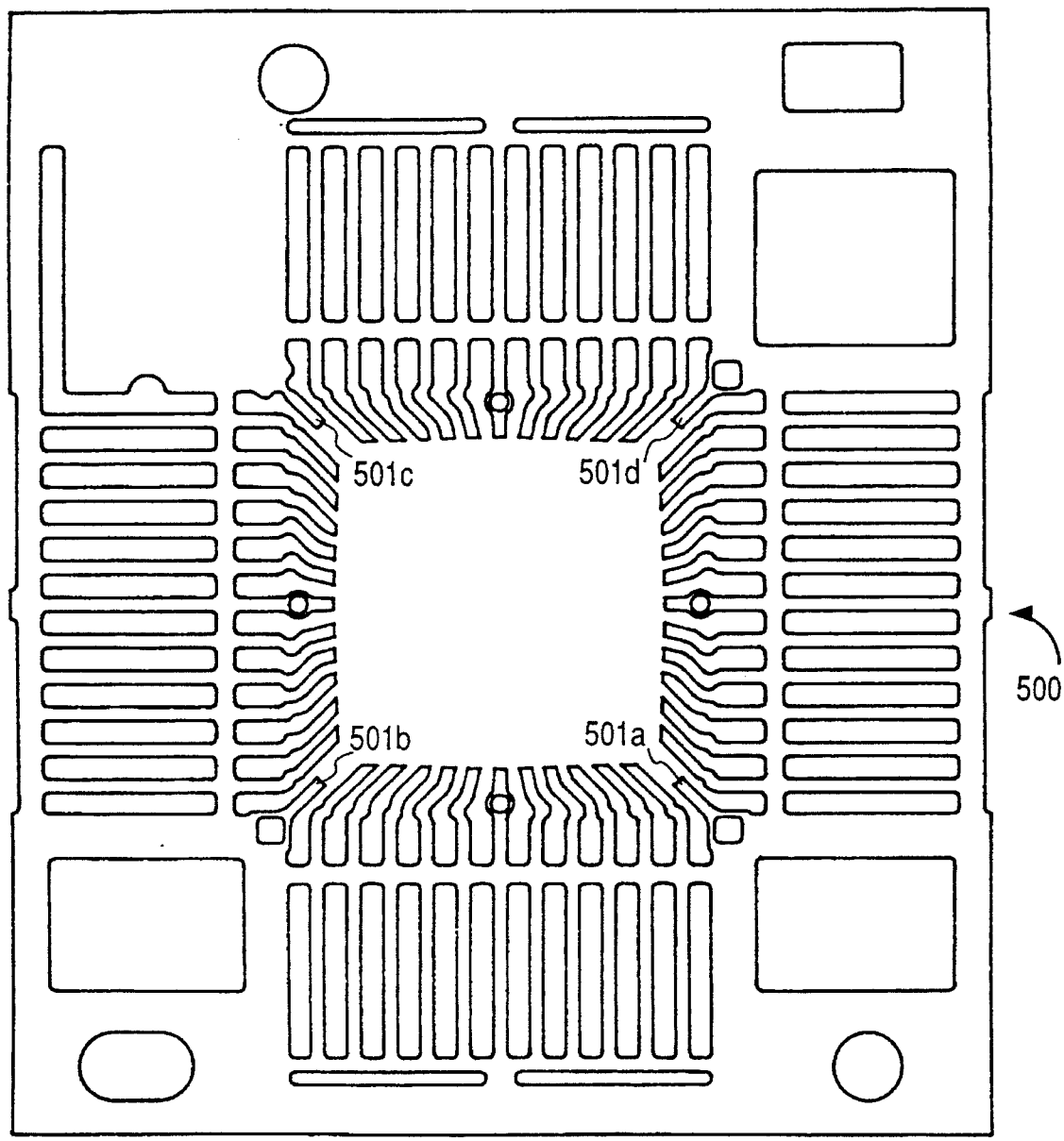
FIG. 10 shows the lead frame 500 of FIG. 9 after severing die attach pad 502 at certain positions in the tie bars 501a–501d.
Figure 11:
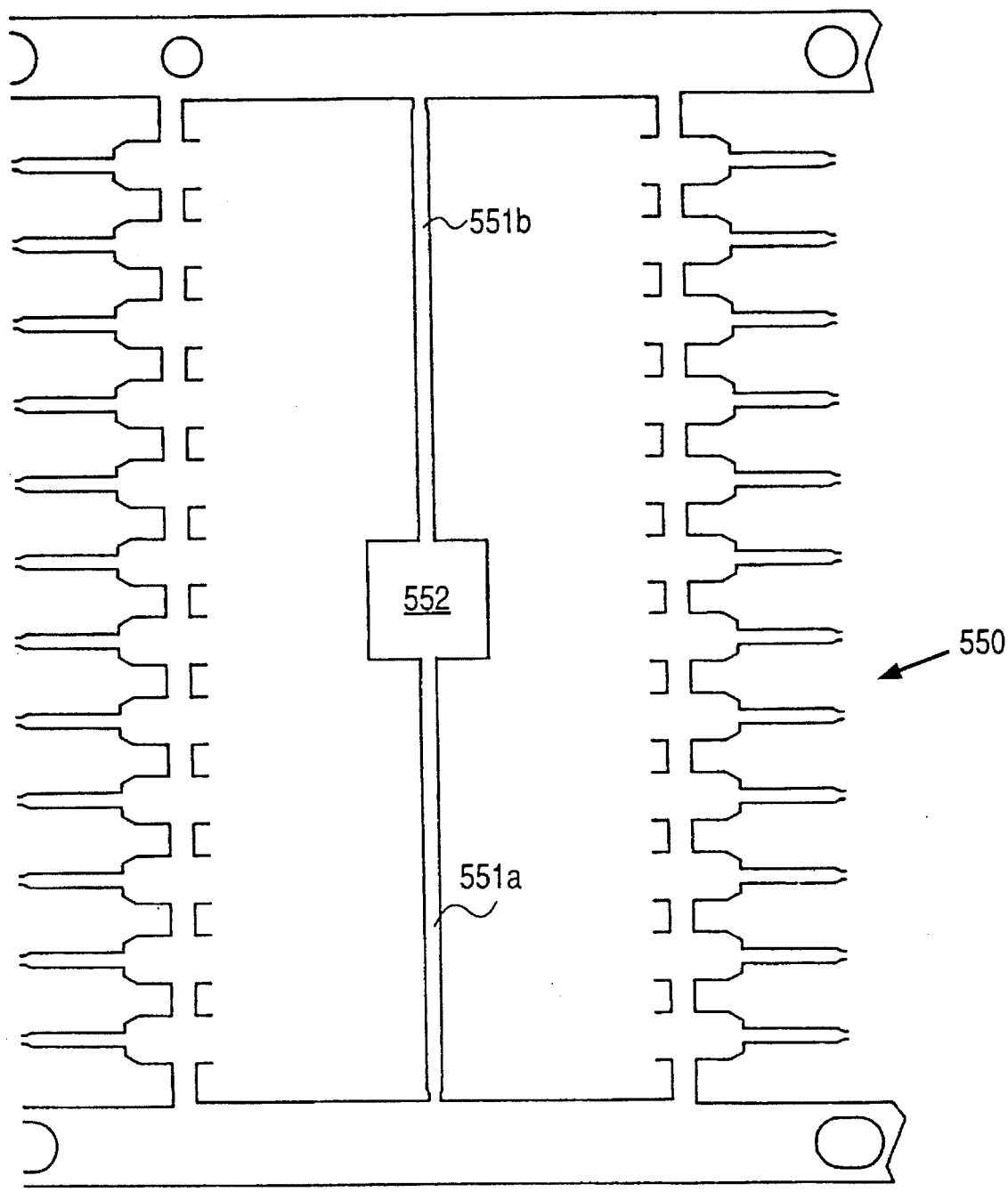
FIG. 11 shows a lead frame 550 suitable for use with the heat sink 250 shown in FIG. 4.

FIG. 9 shows a lead frame 500 suitable for use as the lead frame 400 of FIG. 8. The lead frame 500 is a conventional lead frame having a die attach pad 502. To permit direct attachment of the integrated circuit die onto the heat sink, the die attach pad 502 is severed, such that the lead frame 500 forms an annular structure surrounding the integrated circuit die. Tie bars 501a–501d can be left intact, if desired. Alternatively, the die attach pad 502 can be left intact. In that situation, the die attach pad is attached to the heat sink 200, and the integrated circuit die is attached to the die attach pad 502. If the die attach pad 502 is severed, the tie bars 501a–d can be cut back, leaving only vestiges ("stubs") sufficient to provide mechanical support to bond lead frame 400 to heat sink 200. A lead frame with tie bars cut back is shown in FIG. 10. FIG. 11 shows a lead frame 550 suitable for use in a plastic dual-in-line package with a heat sink, such as heat sink 250 of FIG. 4. The die attach pad 552 of lead frame 550 can be severed at the tie bars 551a and 551b in the same manner as discussed above.

Figure 12:
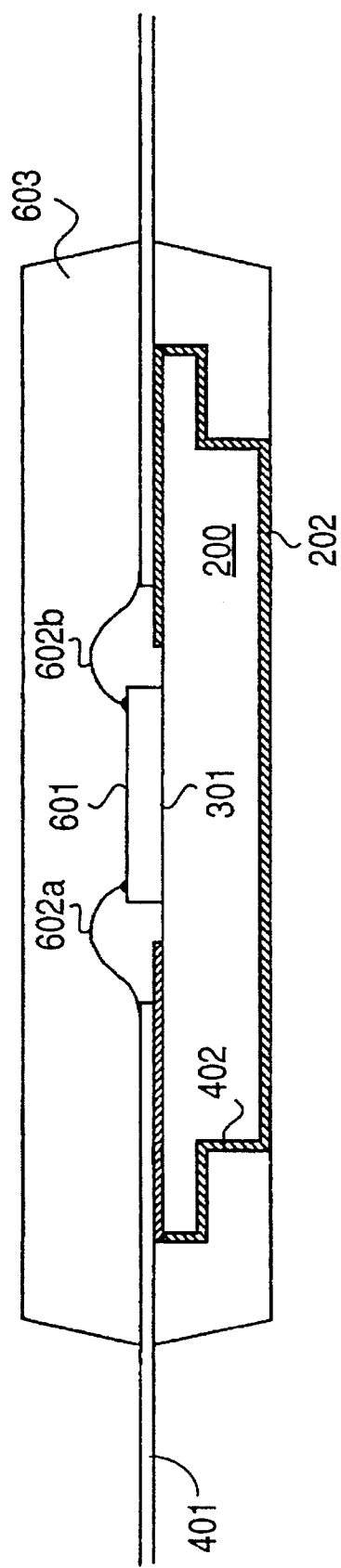
FIG. 12 shows a cross section of the final assembled integrated circuit 600, including the lead frame 401, the heat sink 200, the semiconductor die 601, bond wires 602a and 602b, and plastic encapsulation 603, in accordance with the present invention.

The next steps after attachment of the lead frame are die attach, wire bonding and plastic encapsulation. The final assembly 600 is shown in FIG. 12. The integrated circuit die, shown in FIG. 12 as integrated circuit die 601, can be attached to surface 301 of the heat sink 200 using a resinous die attach, an eutectic die attach, soft solder die attach, or any other suitable die attach method known in the art.

Wire bonding then connects the terminal pads provided on the integrated circuit 601 to corresponding conductors on the lead frame 401. This bonding can be accomplished by a thermosonic wire bonding technique using lead wires, e.g. the lead wires 602a and 602b shown in FIG. 12. Because the anodized aluminum layer 402 is a relatively good thermal conductor, the anodized surface can be used to maintain via the heat sink the wire bonding temperature within the typical desirable range of 5% at the bonding surface. As a result, superior wire bonds can be achieved in accordance with the present invention. Alternatively, connection between the integrated circuit die 601 and the lead frame 401 also can be accomplished by a tape automatic bonding (TAB) method.

Finally, the final assembly including semiconductor die 601, bond wires, such as bond wires 602a and 602b, the heat sink 200 and the lead frame 401, except for the external lead portions, are encapsulated in a plastic material 603 customarily used to create plastic packages. To enhance heat dissipation from the surface 202 of heat sink 200, this surface 202 is flush with the plastic encapsulation 603, so that heat can be dissipated by heat sink 200 directly to the exterior. It will be appreciated that, because of the stepped structure of heat sink 200, moisture from the exterior travels a relatively long path to reach the encapsulated elements, such as bond wires 601a and 601b, resulting in enhanced moisture resistance. It will also be appreciated that the stepped structure locks the heat sink 200 in position inside the plastic encapsulation, and prevent mechanical movements which may lead to dysfunction of the heat sink 200. Adhesives can also be used to enhanced the adhesion of the heat sink 200 to the plastic encapsulation 603, although such adhesion tends to deteriorate over time, due to the difference in thermal characteristics between plastic and the copper and aluminum oxide of heat sink 200. Other structure shapes may be used if desired, including shapes that present a minimum path.

Instead of using a copper heat sink as described above, an aluminum heat sink can also be fabricated from an aluminum metal panel similar to the metal panel 100 described above. Such an aluminum heat sink can be anodized directly without the plating and vapor deposition steps described for the copper heat sink above. However, such an aluminum heat sink has a lesser thermal performance than a copper heat sink. On the other hand, because of the elimination of the plating and chemical vapor deposition steps, the cost of providing such aluminum heat sink is less than its copper counterpart. In some applications, where the thermal dissipation requirements are less demanding, the aluminum heat sink is a cost-effective alternative.

The above detailed description is provided to illustrate specific embodiments of the present invention and not intended to be taken as limiting. It is believed that numerous modifications and variations are possible within the scope of the present invention. For example, using other combinations of electrical insulator with other electrically conductive heat sinks is within the scope of the present invention. For instance, porcelain may be used on a steel heat sink. Other examples of electrically insulative material which can be formed as a thin electrically insulative layer in an electrically conducting heat sink are glass and non-conductive resins. Glass can be applied by a high temperature "firing" process. By contrast, resins can be applied on the desired surfaces by a silk-screen process and cured at a relatively low temperature. The present invention is defined by the following claims.

I claim:

1. An assembly comprising:
   a lead frame;
   a heat sink composed of a thermally conductive material, said heat sink including a stepped structure having a base and a protrusion from said base;
   a layer, having a predetermined thickness, of thermally conductive and electrically insulative material selectively provided on a surface of said base of said stepped structure opposite said lead frame and away from said protrusion for electrically insulating said heat sink from selected portions of said lead frame; and
   a resinous encapsulation for said lead frame and said heat sink, said resinous encapsulation interlocking the stepped structure of said heat sink, thereby minimizing displacement of said heat sink within said resinous encapsulation, said resinous encapsulation positioning a surface of said protrusion of said stepped structure on an opposite side of said surface of said base of said stepped structure, so as to transfer heat generated at said lead frame out of said integrated circuit assembly through said surface of said protrusion of said stepped structure.

2. An assembly as in claim 1, wherein said layer of thermally conductive and electrically insulative material is selected from a group consisting of anodized aluminum, non-conductive resins and non-conductive polymers.

3. An assembly as in claim 1, wherein said resinous encapsulation encapsulates said assembly in plastic, said resinous encapsulation being formed by a molding step.

4. An integrated circuit assembly, comprising:
   a block of thermally conductive material having a thin surface layer of an electrically insulative material of a predetermined thickness, said block including a stepped structure having a base and a protrusion from said base;
   a lead frame attached to a surface of said base of said stepped structure; and
   a resinous encapsulation for said block and said lead frame, said resinous encapsulation interlocking the stepped structure of said block, thereby minimizing displacement of said block within said resinous encapsulation, said resinous encapsulation positioning a surface of said protrusion of said stepped structure on an opposite side of said surface of said base of said stepped structure, so as to transfer heat generated at said lead frame out of said integrated circuit assembly through said surface of said protrusion of said stepped structure.

5. An assembly as in claim 4, wherein said thin surface layer comprises anodized aluminum.

6. An assembly as in claim 4, wherein said thin surface layer comprises an electrically non-conductive polymer.

7. An assembly as in claim 4, wherein said thin surface layer comprises an electrically non-conductive resin.

8. An assembly as in claim 4, wherein:
   said block is electrically conductive;
   and said electrically insulative material is absent at selected sites for lead frame attachment, said lead frame having support members attached at said sites in an electrically conductive manner.

9. An assembly as in claim 8, wherein said electrically conductive manner is selected from the group consisting of welded, soldered, conductively glued or eutectically bonded.

10. An assembly as in claim 9, wherein said support members are each a vestige of a tie bar severed at a die attach area.

11. An integrated circuit assembly, comprising:
   a block of electrically and thermally conductive material forming a heat sink, said block including a stepped structure having a base and a protrusion from said base;
   a thin layer of anodized aluminum selectively formed on a surface of said base of said stepped structure;
   a lead frame attached to said heat sink, such that said thin layer of anodized aluminum selectively insulating said lead frame from said heat sink; and
   a resin encapsulation for said block and said lead frame, said resinous encapsulation interlocking the stepped structure of said block, thereby minimizing displacement of said block within said resinous encapsulation, said resinous encapsulation positioning a surface of said protrusion of said stepped structure on an opposite side of said surface of said base of said stepped structure, so as to transfer heat generated at said lead frame out of said integrated circuit assembly through said surface of said protrusion of said stepped structure.

12. An assembly as in claim 11, wherein said electrically and thermally conductive material is selected from the group consisting of copper and copper alloys.

13. An assembly as in claim 11, further comprising a thin layer of nickel between said anodized aluminum and said block.

14. An assembly as in claim 13, further comprising:

an integrated circuit die attached to said heat sink; and wherein said resinous encapsulation encapsulates said assembly such that a surface of said block is flush with a surface of said resinous encapsulation.

15. An integrated circuit assembly, comprising:

a block of thermally and electrically conductive material, including steel, forming a heat sink, said heat sink including a stepped structure having a base and a protrusion from said base;

a layer of electrically insulative porcelain selectively provided on a surface of said base of said stepped structure;

a lead frame attached to said block, such that said layer of electrically insulative porcelain selectively insulating said block from said lead frame; and a resinous encapsulation for said block and said lead frame, said resinous encapsulation interlocking the stepped structure of said block, thereby minimizing displacement of said block within said resinous encapsulation, said resinous encapsulation positioning a surface of said protrusion of said stepped structure on an opposite side of said surface of said base of said stepped structure, so as to transfer heat generated at said lead frame out of said integrated circuit assembly through said surface of said protrusion of said stepped structure.

16. An integrated circuit assembly, comprising:

a block of thermally and electrically conductive material forming a heat sink, said heat sink including a stepped structure having a base and a protrusion from said base;

a layer of fired glass selectively provided on a surface of said base of said stepped structure;

a lead frame attached to said block, such that said layer of fired glass selectively insulating said block from said lead frame; and a resinous encapsulation for said block and said lead frame, said resinous encapsulation interlocking the stepped structure of said block, thereby minimizing displacement of said block within said resinous encapsulation, said resinous encapsulation positioning a surface of said protrusion of said stepped structure on an opposite side of said surface of said base of said stepped structure, so as to transfer heat generated at said lead frame out of said integrated circuit assembly through said surface of said protrusion of said stepped structure.

17. A heat sink comprising:

a first portion having a first surface for attaching thereon an integrated circuit die; and a second portion protruding from said first portion in a direction away from said first surface thereby forming a stepped structure between said first and second portions, said second portion having a second surface opposite said first surface, said second surface conducting heat generated at said integrated circuit die out of said heat sink, wherein exposed surfaces of said first and second portions are provided a layer of thermally conductive and electrically insulative material except at selected areas.

18. An assembly comprising:

a lead frame;

a heat sink composed of a thermally conductive material, said heat sink including a stepped structure having a base and a protrusion from said base, so as to have a top surface on said protrusion and a bottom surface on said base, said top surface being substantially parallel to and smaller in size than said bottom surface;

a layer, having a predetermined thickness, of thermally conductive and electrically insulative material selectively provided on said bottom surface of said heat sink for electrically insulating said heat sink from selected portions of said lead frame; and a resinous encapsulation for said lead frame and said heat sink, said resinous encapsulation interlocking said stepped structure so as to secure said heat sink in said resinous encapsulation while exposing said top surface flush with a surface of said resinous encapsulation.

* * * * *